US 6,429,469 B1

(12) United States Patent
Allen et al.

(10) Patent No.: US 6,429,469 B1
(45) Date of Patent: Aug. 6, 2002

(54) OPTICAL PROXIMITY CORRECTION STRUCTURES HAVING DECOUPLING CAPACITORS

(75) Inventors: Archibald J. Allen, Grand Isle; Orest Bula, Shelburne; John M. Cohn, Richmond; Daniel Cole, Jericho; Edward W. Conrad, Jeffersonville; William C. Leipold, Enosburg Falls, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/705,031

(22) Filed: Nov. 2, 2000

(51) Int. Cl.[7] .............................................. H01L 27/10
(52) U.S. Cl. ...................... 257/207; 257/202
(58) Field of Search ................. 257/98, 379, 207, 257/301, 202, 206

(56) References Cited

U.S. PATENT DOCUMENTS

| | | |
|---|---|---|
| 5,272,590 A | 12/1993 | Hernandez |
| 5,583,739 A | 12/1996 | Vu et al. |
| 5,656,834 A | 8/1997 | Grzyb et al. |
| 5,671,175 A * | 9/1997 | Liu et al. ............... 365/149 |
| 5,687,109 A | 11/1997 | Protigal et al. |
| 5,759,907 A | 6/1998 | Assaderaghi et al. |
| 5,770,875 A | 6/1998 | Assaderaghi et al. |
| 5,841,182 A | 11/1998 | Linn et al. |
| 5,874,778 A | 2/1999 | Bhattacharyya et al. |
| 6,309,809 B1 * | 10/2001 | Starikov et al. ............ 430/395 |
| 6,316,340 B1 * | 11/2001 | Hwang et al. ............. 438/524 |

* cited by examiner

Primary Examiner—Richard Elms
Assistant Examiner—Brad Smith
(74) Attorney, Agent, or Firm—McGinn & Gibb, PLLC; Richard A. Henkler, Esq.

(57) ABSTRACT

A structure for a semiconductor chip which includes a first region having first cells for storing and processing data, and a second region outside the first region having OPC structures, wherein the OPC structures comprise decoupling capacitors. The line widths of the active gates of first cells are the same size or similar in size as the OPC structures. The OPC structures reduce proximity effects of active devices in the first cells, and comprise N-type FETs and P-type FETs, that are located in the second region. The OPC structures may have a width greater than the first cells. The second region can be multiple OPC structures, whereby the second region comprises multiple decoupling capacitors. The active devices in the first cells are separated by a first distance and the OPC structures are separated from the active devices by the first distance.

7 Claims, 3 Drawing Sheets

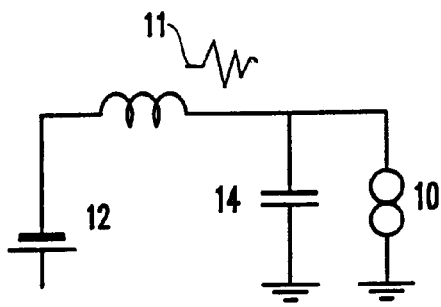
FIG.1 PRIOR ART
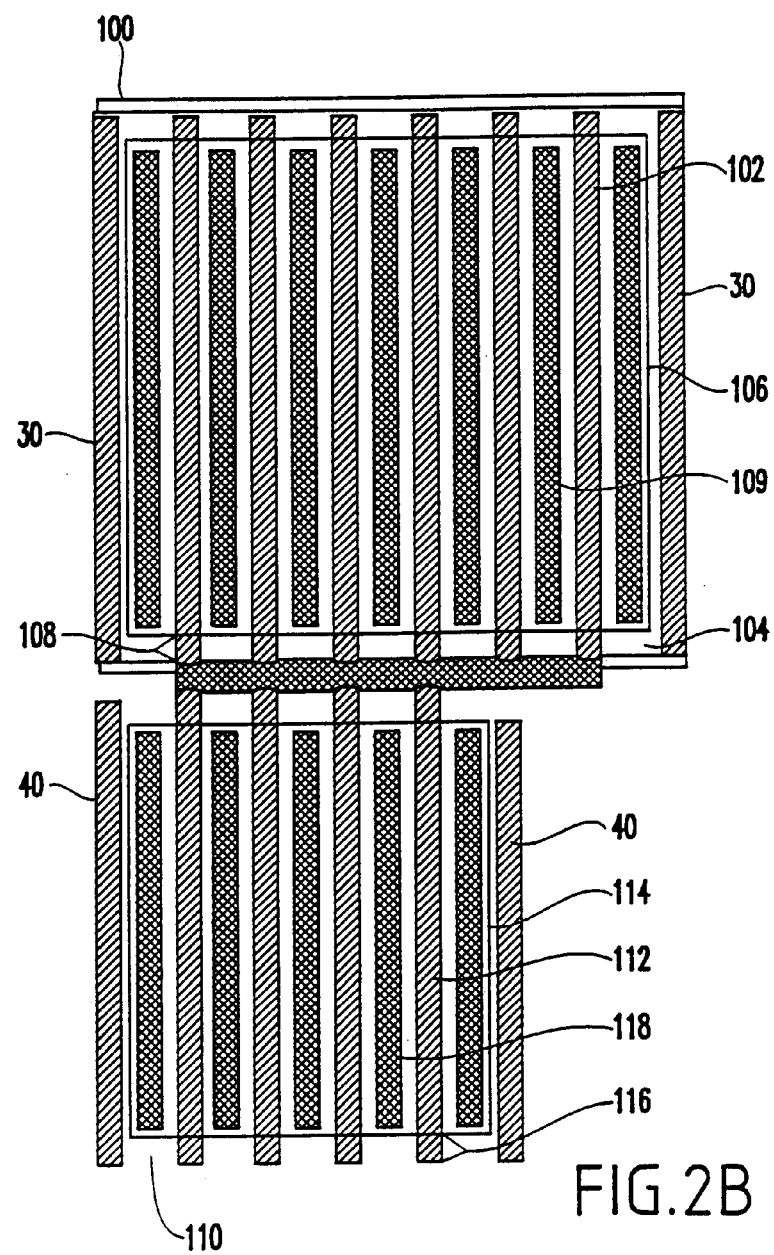
FIG.2A PRIOR ART
FIG.2B PRIOR ART

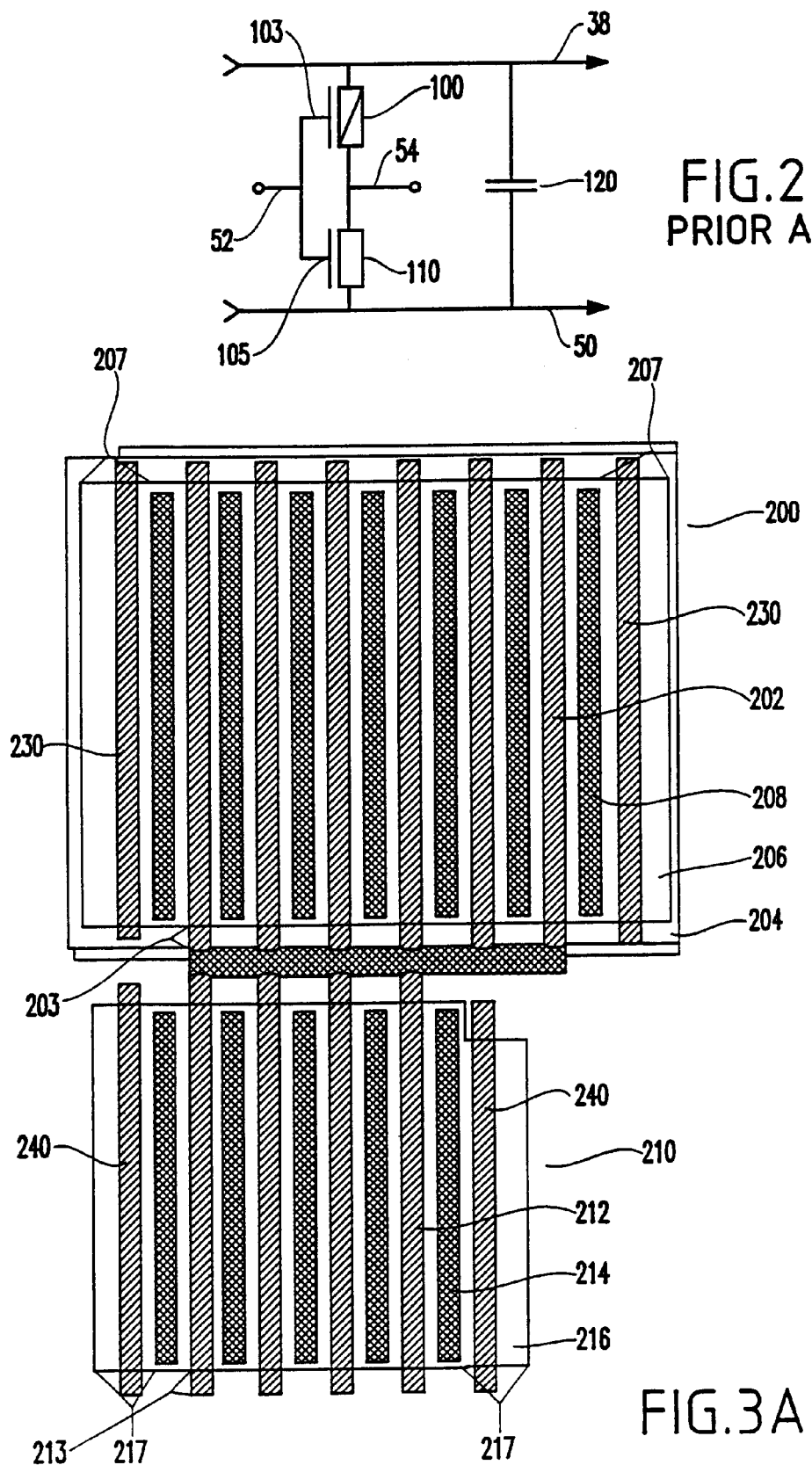

OPTICAL PROXIMITY CORRECTION STRUCTURES HAVING DECOUPLING CAPACITORS

BACKGROUND OF THE INVENTION

1. Field of the Invention

The present invention relates to embedded decoupling capacitors, particularly for silicon on insulator (SOI) technology, which reduce noise and help solve edge cell proximity effect problems, thereby, eliminating the need for separate decoupling capacitors and OPC structures.

2. Description of the Related Art

Modern society places ever increasing demands on microelectronics technology. Today, chips are already functioning at speeds approaching the gigahertz range and current trends continue to demand that chips process increasing amounts of electronic signals using less space and less time. Chips are widely used in a variety of applications such as personal computers, memory banks, cell phones, and other electronic devices well known to those skilled in the art. Regardless of the exact application, the structure of the chip controls the speed at which the chip may function and the quantity of electronic signals that the chip can process.

Each chip has a semiconductor substrate with thousands of circuits that store and process electronic signals. To meet the ever increasing demand for high speed and high signal volume microelectronics, the number of circuits on the chips is increased. However, the number of circuits, and thus, advances in microelectronics, is limited by the availability of space on the surface of the chips.

The space on the chip is limited by two suboptimization features of the circuits on the chip. First, to reduce the noise resulting from the high speed data transmission, blocks of circuits require decoupling capacitors. Decoupling capacitors are relatively large structures and are used between a power supply and ground to provide enough noise immunity for proper circuit operation. For example, FIG. 1 is a simple diagram showing a buffer cell 10, a power supply 12 and noise 11 on the power line that is damped by a large decoupling capacitor 14.

Second, devices require at least two outer optical proximity correction (OPC) structures to reduce the optical diffraction effects caused by a change in the proximity environment at the edge of a line of active gates. The OPC structures are arranged by a process to correct the full chip layout data set. This process may be performed after a chip layout is generated by a technique called optical proximity correction or during the design process the OPC structures may be placed at either end of the line of the active gates in the circuits. In this position, the OPC structures reduce proximity effects by providing the active gates with the same local environment as the active gates in the middle of an array of gates. The use of OPC structures on the periphery of an array is an acceptable solution for stand-alone array chips or even for Application Specific Integrated Circuit (ASIC) chips where the array elements form a small fraction of the total chip area because the relative amount of space occupied by the OPC structures is small.

To optimize chip processing speeds and increase the amount of data processed, there is a need to effectively use space on the surface of the chips. As a result, it is advantageous to integrate decoupling capacitors and OPC structures without increasing noise or diffraction effects.

SUMMARY OF THE INVENTION

It is, therefore, an object of the present invention to provide a structure and method for providing a semiconductor chip which includes a first region having first cells for storing and processing data, and a second region outside the first region having OPC structures, wherein the OPC structures comprise decoupling capacitors. The line widths of the active gates of first cells are the same size or similar in size as the OPC structures. The OPC structures reduce proximity effects of active devices in the first cells, and comprise N-type FETs and P-type FETs, that are located in the second region. The OPC structures may have a width greater than the first cells. The second region can be multiple OPC structures, whereby the second region comprises multiple decoupling capacitors. The active devices in the first cells are separated by a first distance and the OPC structures are separated from the active devices by the first distance.

A further embodiment of the invention is a semiconductor device, which includes a substrate, a first transistor having a first plurality of parallel elongated gates, the first transistor formed in a region of the substrate, and at least one OPC structure formed coplanar with and extending parallel to an outermost gate of the first plurality of elongated gates, wherein the OPC structure acts as a decoupling capacitor and an optical proximity corrector. The first plurality parallel elongated gates may have a same line width as the OPC structure, wherein the OPC structure reduces proximity effects of the first cells and the first plurality of parallel elongated gates is adapted to store and process data. The OPC structure may have a width greater than one gate of the first plurality of parallel elongated gates. The first transistor comprises multiple OPC structures and whereby the transistor comprises multiple decoupling capacitors. Each gate of the first plurality of parallel elongated gates of first cells is separated by a first distance, and the OPC structure is separated from the first plurality of parallel elongated gates by the first distance.

The invention further embodies a semiconductor device which includes a first region having first cells for storing and processing data wherein each of the first cells comprise devices separated by a first distance, and a second region outside the first region having OPC structures wherein the OPC structures are parallel and coplanar to an outermost device in a first cell of the first cells and one of the OPC structures is separated from the outermost first cell by the first distance, wherein the OPC structures comprise decoupling capacitors. The first cells comprise a same or similar line width as the OPC structures. The OPC structures reduce proximity effects of the first cells and further comprise a N-type FET and a P-type FET, wherein the N-type FET and the P-type FET each comprise the first region and the second region. The OPC structures may comprise a width greater than a width of the first cells, and the second region may comprise multiple OPC structures whereby the second region comprises multiple decoupling capacitors.

BRIEF DESCRIPTION OF THE DRAWINGS

The invention will be described in detail with reference to the following drawings in which like reference numerals refer to like elements and wherein:

FIG. 1 is a layout of a circuit having a decoupling capacitor;

FIG. 2A is a layout of a conventional decoupling capacitor;

FIG. 2B is a schematic diagram of an NFET and PFET comprising buffer cells;

FIG. 2C is a schematic diagram of a circuit diagram corresponding to the structure shown in FIG. 2A;

FIG. 3A is a layout of a buffer cell with a decoupling capacitor according to the present invention;

DETAILED DESCRIPTION OF PREFERRED EMBODIMENTS OF THE INVENTION

Figure 3B:
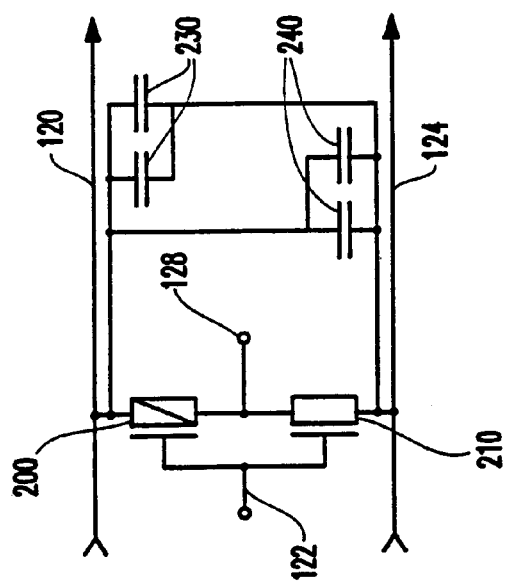
FIG. 3B is a schematic diagram of a circuit diagram corresponding to the structure shown in FIG. 3A.

The present invention provides a structure for the surface of a semiconductor device which combines into one device the decoupling capacitor and OPC structure. As a result, less semiconductor surface space is required to reduce the noise and proximity effects associated with high speed processing. As depicted in FIGS. 1 and 2A–2C, prior to this invention, two devices were needed to control these suboptimization problems. A decoupling capacitor 14 in FIGS. 1 and 20 in FIGS. 2A and 2C eliminates noise, and OPC structures (not shown in FIG. 1) reduce proximity effects. FIG. 2A is a diagram of a conventional decoupling capacitor that would be used on the wafer to reduce noise. One decoupling capacitor 20 is used with each OPC structure of P-type field effect transistors (PFET) 100 and N-type field effect transistors (NFET) 110. As depicted in the circuit diagram of FIG. 2C, the decoupling capacitor is wired to the PFET 100 and NFET 110 between the VDD rail 38 and the ground rail 50. The decoupling capacitor has a gate 22, a source drain contact 24, diffusion area 26 and a N-well 28.

FIG. 2B depicts a set of a PFET 100 and a NFET 110. OPC structures 30 and 40 are on the outer portions of the PFET 100 and NFET 110, respectively. The overall structure of the PFET device 100 includes a series of gates 102, N-well region 104 having a source/drain diffusion region 106 and OPC structures 30 located outside the source/drain diffusion region 106. A source/drain contact region 109 is also provided within the source/drain diffusion region 106. A gate region 102 is provided within the source/drain diffusion region 106 and an extended gate portion 108 extends out from beyond the source/drain diffusion region 106. The polysilicon gate extends beyond the diffusion region to enable proper definition of the PFET under conditions of mask mis-alignment or other process variations.

Similarly, the NFET device 110 includes a series of gates 112, source/drain diffusion regions 114 and OPC structures 40 located outside the source/drain diffusion region 114. The NFET device 110 also includes source/drain contact regions 118 as well as gate regions 112 within the source/drain diffusion region 114 and extended gate portions 116 that extend beyond the source/drain diffusion region 114.

The OPC structures 30 and 40 and series of gates 102 and 112 of the PFET device 100 and NFET 110 device are each made of a conductive material such as polysilicon. The OPC structures 30 and 40 may also be the same line width, size and shape as the individual gates. However, there are two major differences between OPC structures 30 and 40 and gates 102 and 112. First, the OPC structures 30 and 40 are inactive while the gates 102 and 112 are active. Second, the OPC structures 30 and 40 are located entirely outside of the diffusion regions 106 and 114 while only the outermost portions 108 and 116 of the gates are located outside the diffusion regions 106 and 114.

Metal layers (not shown) connect the source region of the PFET device 100 to a positive power source 16 and connect the source region of the NFET device 110 to the ground. The drain regions from each of the devices are connected at a common output.

FIG. 2C more specifically shows that the PFET device 100 has its source region connected to the positive power source 38 and its gate region 102 connected (via 103) to the input terminal 52. The NFET device 110 has its gate region 112 connected (via 105) to the input 52 terminal and its source region connected to the ground 50. The drain region of the NFET device 110 is connected to the drain region of the PFET device 100 at an output terminal 54. The decoupling capacitor 20 has its gate region 22 connected to the ground 50 and its diffusion area 26 connected to the positive power source 38. According to this conventional design, the sum of the chip space utilized by the OPC structures and decoupling capacitor equated to 20% of the active chip area.

The present invention extends the diffusion regions of the NFET and PFET and embeds the decoupling capacitor into the OPC structures. Thereby, the invention eliminates the need for a separate decoupling capacitor 20 as depicted in FIG. 2A. FIG. 3A depicts the simplified structure of the invention and includes a diagram of a set of a PFET 200 and NFET 210, according to the present invention.

FIG. 3A includes features similar to the features depicted by FIG. 2A, but FIG. 3A has been modified according to the present invention. Similar to FIG. 2A, the PFET device 200 includes a series of gates 202, OPC structures 230, an N-well region 204 having a source/drain diffusion region 206. Source/drain contact regions 208 are provided within the source/drain diffusion region 206. Gates 202 are provided within the source/drain diffusion region 206 and have extended portions 203, which extend beyond the source/drain diffusion region 206. The diffused region 206 also has two lateral extensions 207, as compared with the NFET diffused region 106 in FIG. 2B.

Also, similar to FIG. 2A, the NFET device 210 includes a series of gates 212, OPC structures 240, source/drain contact regions 214 within the diffusion region 216. Gate regions 212 are provided within the diffusion region 216 and have an extended portion 213, which extends beyond the diffusion region 216. The diffused region 216 also has two lateral extensions 217, as compared with the NFET diffused region 114 in FIG. 2B.

A key difference between the invention, as depicted in FIGS. 3A and 3B, and the structure shown in FIGS. 2A–C is the use of an embedded decoupling capacitor to reduce noise and proximity effects rather than the OPC structures and separate decoupling capacitor 20. The decoupling capacitor is embedded into the OPC structures 230 and 240 by enlarging the diffusion regions 206 and 216 such that the lateral portions 207 and 217 of the diffusion regions 206 and 216 encompass the OPC structures 230 and 240. The enlargement of the diffusion region permits the inherit capacitance characteristics of the polysilicon OPC structures to become active and provide decoupling capacitance. Thus, the invention is able to reduce noise and proximity effects using only the OPC structures, and the finished combination OPC structure and embedded decoupling capacitor is significantly smaller than the two separate devices in FIG. 2A.

FIG. 3B shows a circuit diagram corresponding to the FIG. 3A device. As shown, the PFET device 200 has its source region connected to the positive power supply 120 and its gate region 202 connected to the input terminal 122. The NFET device 210 has its source region connected to the ground 124 and its gate region 212 connected to the input terminal. The drain region of the PFET device 200 and the drain region of the NFET device 210 are commonly connected at an output terminal 128. FIG. 3B further shows the OPC structures 230 and 240. The OPC structures are connected as shown in FIG. 3B. More particularly, OPC structures 240 are connected to ground, and OPC structures 230 are connected to the positive power supply.

While FIG. 3A depicts each OPC structure 230 and 240 as preferably having the same width as the corresponding gate regions, the outer OPC structures 230 and 240 may be made wider or several more could be added. This provides better power supply decoupling in the same space as the FIG. 2A design.

Figure 4:
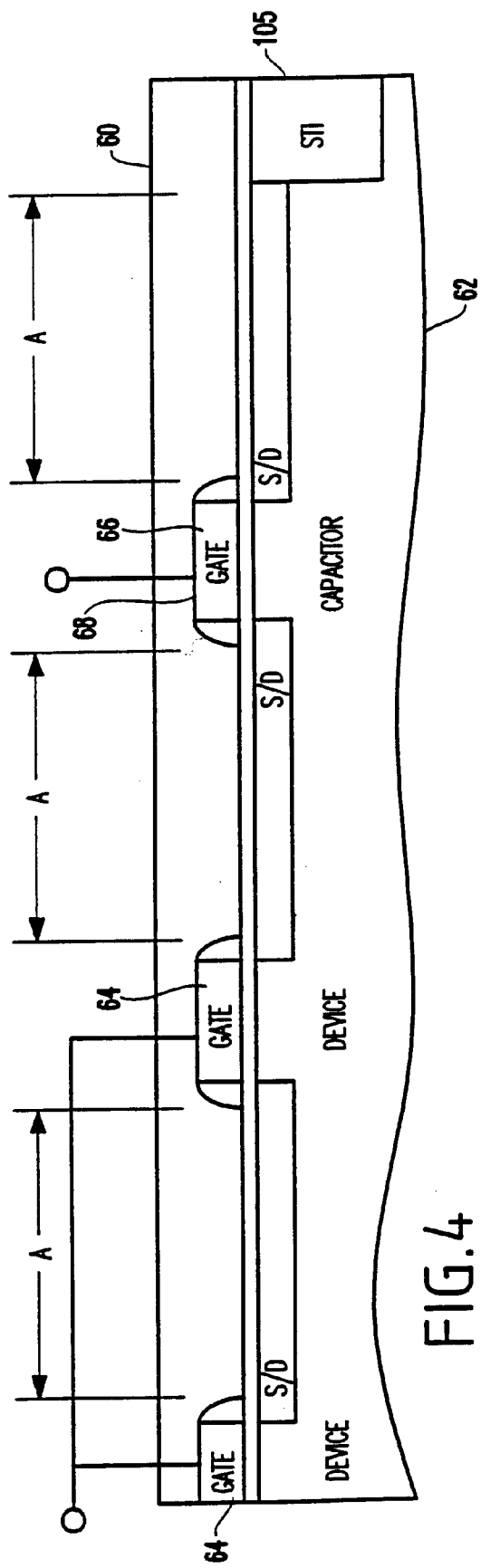
FIG. 4 is a schematic diagram of a cross section through a portion of the device and the decoupling capacitor.

FIG. 4 is a partial cross-section through a portion of the chip 105 and the embedded decoupling capacitor 66. The top capacitor plate 68 is preferably made of gate polysilicon. The bottom plate 62 of the capacitor is a silicon island, which would preferably be grounded. The capacitor dielectric is gate dielectric. As such, no separate dielectric is required for the capacitor. The capacitor uses the same dielectric layer as the NFETs and PFETs. FIG. 4 shows the two gate regions 64 and one of the embedded capacitor OPC structures 66. As indicated by the symbol AA@, the OPC structure maintains the same spacing between adjacent gates.

There are several benefits to embedding the capacitor into the polysilicon OPC structures. First, the embedded capacitor eliminates the need for the large capacitor and requires less space on the chip. The freed space can then be filled with more cells and lead to a chip that is capable of handling increased amounts of data at a faster rate. Second, integration of the OPC correction with decoupling capacitors facilitates a design methodology in which decoupling capacitors are added at device layout time, either based simply on device size or based on designer-specified parameters in the circuit schematic. This leads to optimal placement and density compared to later placement of discrete components. As a result, the invention provides less series resistance between the decoupling capacitor and the device than the traditional discrete decoupling capacitor. This increases the effectiveness of the decoupling capacitor especially at high frequency by reducing the Resistor/Capacitor (RC) delay and enhancing the performance of the gates. Lastly, building the capacitor into the array, allows the decoupling capacitor to more closely match the array proximity environment.

While the invention has been described with reference to specific embodiments, the description is illustrative only and is not to be considered as limiting the scope of the invention. Various other modifications and changes may occur to those skilled in the art without departing from the spirit and scope of the invention.

What is claimed is:

1. A semiconductor chip comprising:
   a N-type FET having first cells for storing and processing data; and
   a P-type FET outside said first region having Optical Proximity Correction (OPC) structures that include decoupling capacitors.

2. A semiconductor chip comprising:
   a first region having first cells for storing and processing data; and
   a second region outside said first region having Optical Proximity Correction (OPC) structures that include decoupling capacitors, the OPC structures having a width greater than that of the first cells.

3. A semiconductor chip comprising:
   a first region having first cells for storing and processing data; and
   a second region outside said first region having multiple Optical Proximity Correction (OPC) structures each of which include a decoupling capacitor.

4. A semiconductor device comprising:
   a substrate;
   a first transistor having a first plurality of parallel elongated gates, said first transistor formed in a region of said substrate; and
   at least one Optical Proximity Correction (OPC) structure formed coplanar with and extending parallel to an outermost gate of said first plurality of elongated gates, the OPC structure acting as a decoupling capacitor and an optical proximity corrector and having a width greater than one gate of the first plurality of parallel elongated gates.

5. A semiconductor device comprising:
   a substrate;
   a first transistor having a first plurality of parallel elongated gates, said first transistor formed in a region of said substrate; and
   a plurality of Optical Proximity Correction (OPC) structure formed coplanar with and extending parallel to an outermost gate of said first plurality of elongated gates, each of the OPC structure acting as a decoupling capacitor and an optical proximity corrector.

6. A semiconductor device comprising:
   a N-type FET having first cells for storing and processing data wherein each of said first cells comprise devices separated by a first distance; and
   a P-type FET outside said first region having Optical Proximity Correction (OPC) structures that are parallel and coplanar to an outermost device in a first cell of the first cells, and one of said OPC structures is separated from said outermost first cell by said first distance, the OPC structures including decoupling capacitors.

7. A semiconductor device comprising:
   a first region having first cells for storing and processing data wherein each of said first cells comprise devices separated by a first distance; and
   a second region outside said first region having Optical Proximity Correction (OPC) structures that are parallel and coplanar to an outermost device in a first cell of the first cells, and one of said OPC structures is separated from said outermost first cell by said first distance, each of the OPC structures including a decoupling capacitor and having a width greater than a width of the first cells.

\* \* \* \* \*